United States Patent [19]

Bokil

[11] Patent Number: 4,685,200
[45] Date of Patent: Aug. 11, 1987

[54] LOW INTERNAL TEMPERATURE TECHNIQUE FOR HERMETIC SEALING OF MICROELECTRONIC ENCLOSURES

[75] Inventor: Delip R. Bokil, Winchester, Mass.

[73] Assignee: Analog Devices, Incorporated, Norwood, Mass.

[21] Appl. No.: 340,279

[22] Filed: Jan. 18, 1982

[51] Int. Cl.$^4$ .............................................. H01L 21/58
[52] U.S. Cl. ...................................... 437/215; 357/72; 357/74; 357/81; 219/85 BA; 219/339; 219/347; 219/349; 219/350; 65/43; 65/48; 437/221
[58] Field of Search ............... 29/588, 589; 174/52 H; 219/858, 339, 347, 349, 350; 65/43, 48; 357/72, 74, 81

[56] References Cited

U.S. PATENT DOCUMENTS

| | | | |
|---|---|---|---|
| 3,283,124 | 1/1966 | Kawecki | 219/349 |
| 3,404,215 | 10/1968 | Burks et al. | 65/58 |
| 3,586,813 | 7/1970 | Cruickshank et al. | 219/347 |
| 3,683,146 | 8/1972 | Nugent et al. | 219/349 |
| 3,735,211 | 5/1973 | Kaphias | 29/588 |
| 4,005,457 | 1/1977 | Hill et al. | 357/72 |
| 4,291,815 | 9/1981 | Gordon et al. | 29/588 |
| 4,400,870 | 8/1983 | Islam | 29/588 |

FOREIGN PATENT DOCUMENTS

| | | | |
|---|---|---|---|
| 56-158458 | 7/1981 | Japan | 29/580 |
| 7200194 | 8/1972 | Netherlands | 213/349 |

Primary Examiner—Brian E. Hearn
Assistant Examiner—Beverly A. Pawlikowski
Attorney, Agent, or Firm—Parmelee, Bollinger & Bramblett

[57] ABSTRACT

A technique for enclosing microelectronic circuit elements in hermetically sealed packages comprising a planar ceramic substrate with a box-like ceramic cover sealed thereto by a fused glass coating. The glass sealant is applied to the substrate in the form of a paste which thereafter is fired at high temperature and cooled to produce a smooth glass coating. With the cover in place on the substrate, the glass coating is remelted by heat developed by infra-red radiation developed by four line-focussed radiant heaters at the four sides of the package. The radiation of each heater is focussed at the interface line between the cover and the substrate. Because the radiant heat is concentrated along the interface line, unwanted heat transfer into the package is minimized, and the temperature is prevented from rising sufficiently to damage heat-sensitive elements. Upon removal of the radiant heat, the glass hardens in a condition of fusion and/or chemical bonding with the cover and substrate providing true hermetic sealing.

2 Claims, 5 Drawing Figures

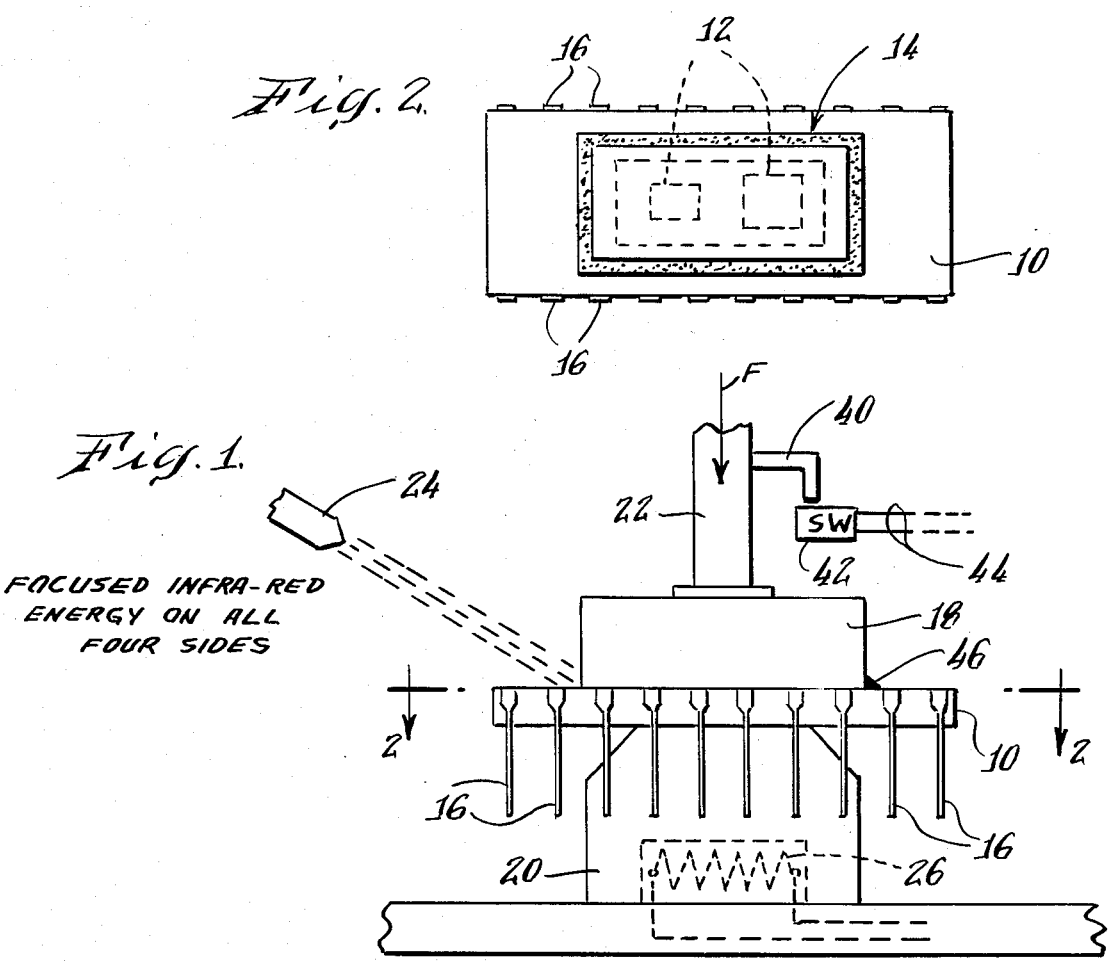
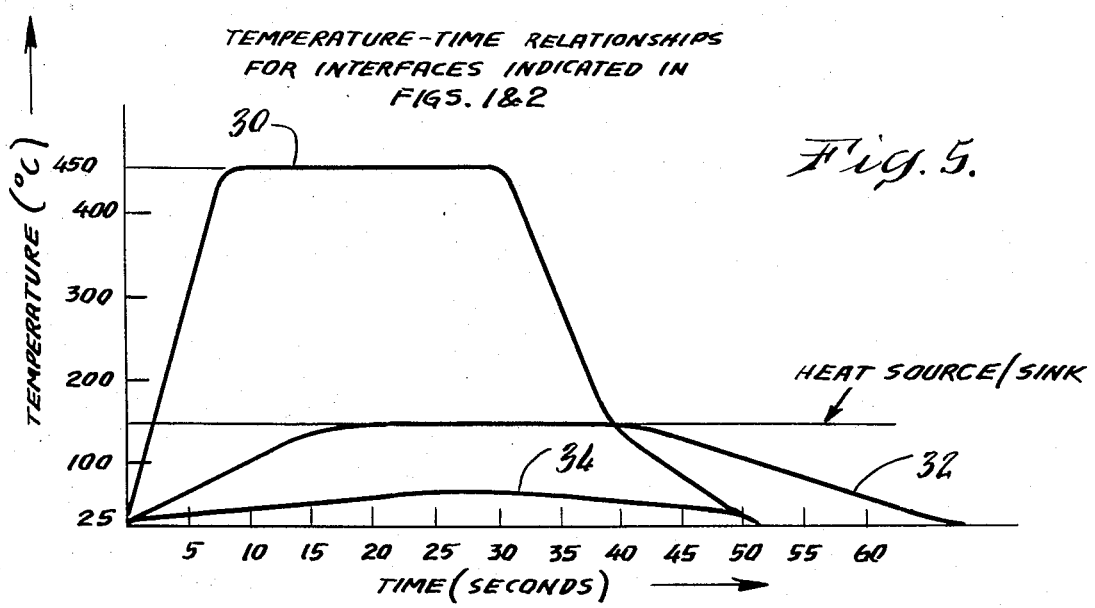

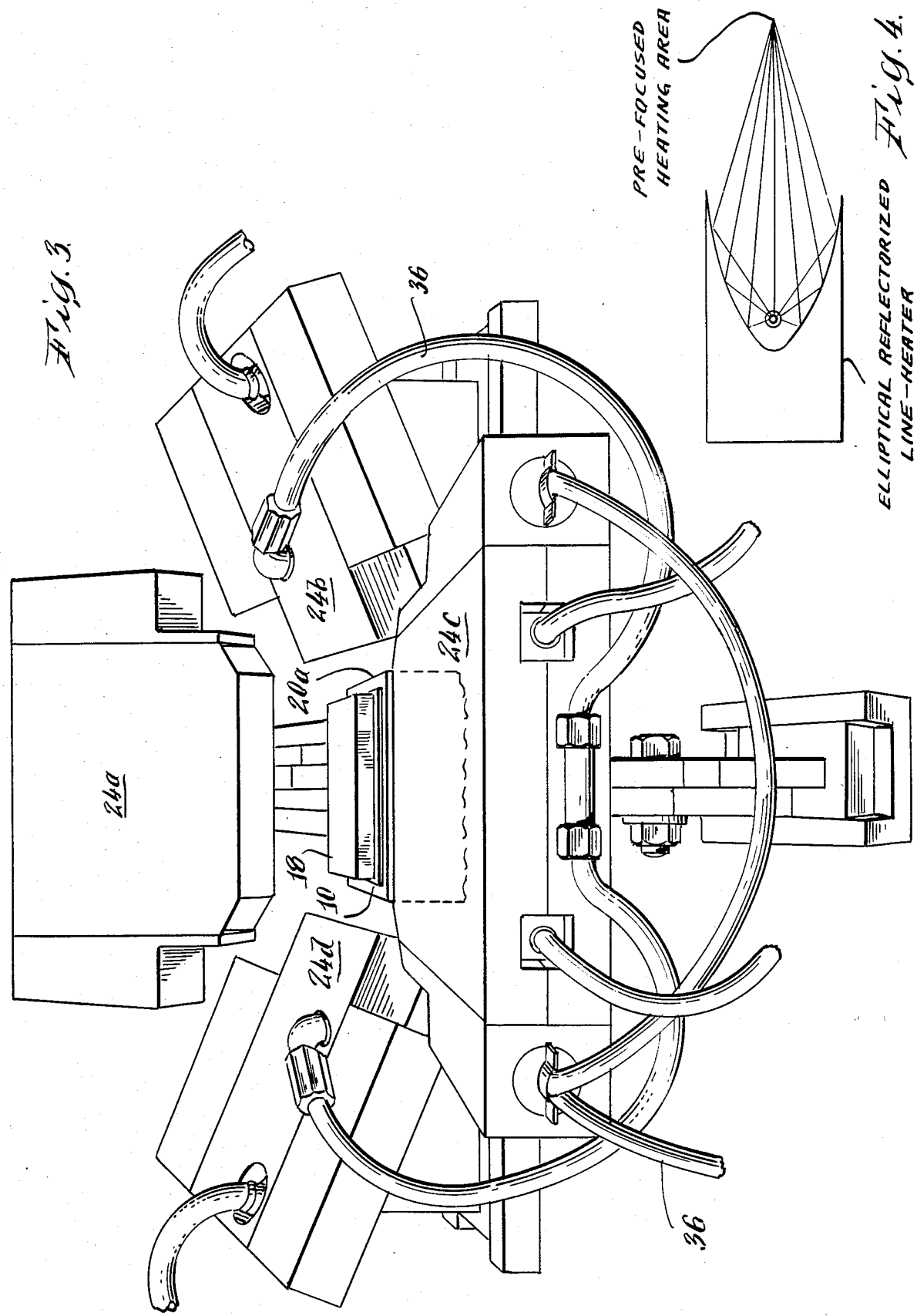

LOW INTERNAL TEMPERATURE TECHNIQUE FOR HERMETIC SEALING OF MICROELECTRONIC ENCLOSURES

BACKGROUND OF THE INVENTION

1. Field of the Invention

This invention relates to the packaging of temperature-sensitive microelectronic devices including semiconductors and hybrid integrated circuits and the like. More particularly, this invention relates to improvd packaging techniques capable of producing hermetically sealed packages with a relatively low rise in the interior package temperature, thereby assuring that the enclosed circuitry is not damaged by heat. In the package to be described, the circuit elements are fabricated on a planar ceramic substrate with a rimless four-sided cover sealed thereto by means of a fused glass frit sealing compound.

2. Description of the Prior Art

A variety of ways have been developed for packaging microelectronic elements. Packaging of IC chips commonly includes the use of conduction-convection or IR furnaces to heat the package components to sealing temperature. The high interior package temperatures that result from use of such a furnace do not injure IC chips which already have been subjected to high-temperature processing including annealing. Such high interior temperatures however are not acceptable for packaging certain other types of microelectronic devices which are quite temperature-sensitive, particularly those incorporating hybrid integrated circuitry, and involving components which are mounted using organic adhesives. Thus, there has been a need for a commercially satisfactory packaging technique which does not raise the internal package temperature significantly, thereby to avoid damage to temperature-sensitive circuit elements.

Prior attempts have been made to solve this problem. For example, reference may be made to Zimmerman U.S. Pat. No. 3,973,388 which shows (see FIGS. 6c–6f) a heater core 58 arranged to be moved into a position surrounding the package lid to apply heat directly by conduction to the rim of the lid. Heat transferred through this rim melts solder which seals the lid to the substrate. Zimmerman provides heat sinks engaged with both the lid and the base to carry off heat with the objective of preventing the interior temperature from rising so high as to damage the packaged circuit elements.

The Zimmerman approach presents a number of problems. First, it is not clear that the package interior will not in practice reach excessively high temperatures for many commercial applications, particularly since the heater core closely surrounds the entire lid and will transfer heat throughout the side wall areas of the lid during the sealing process. Also, the heat is applied only to one side of the interface junction, and proper heating of the solder can be interfered with by camber of the sealing surfaces of either the lid or the base. Moreover, the Zimmerman scheme requires that the lid preferably have a rim, which undesirably takes up valuable space and moreover is difficult to construct with certain types of advantageous materials such as ceramic. In addition, the described technique is not well suited for cost-effective, mass production of electronic components.

Accordngly, it is an object of this invention to provide improved packaging techniques for microelectronic devices. A further object of the invention is to provide a packaging technique, and packages produced thereby, offering hermetic sealing of temperature-sensitive circuit elements with reduced internal temperature during the sealing procedure. Other objects, aspects and advantages of the invention will in part be pointed out in, and in part apparent from, the following description of a preferred embodiment considered together with the accompanying drawings.

SUMMARY OF THE INVENTION

In a preferred embodiment of the present invention, to be described hereinafter in detail, microelectronic circuit elements are fabricated on a ceramic substrate and hermetically protected by a ceramic box-like cover sealed to the substrate by a glass frit fused to both the substrate and the cover at the interface therebetween. In this embodiment, the substrate is prepared for sealing by screen-printing a paste-like glass frit compound along a rectangular path surrounding the region to carry the microelectronic elements. This glass frit is fired at high temperature and cooled to provide a smooth glass coating. The microelectronic circuit elements then are fabricated on the substrate, and the ceramic cover is placed in position over these elements to complete the package structure.

Infra-red radiation from line-focussed sources then is directed simultaneously to all of the interface regions between the substrate and the cover to remelt the glass coating and cause it to fuse into and/or chemically bond with the ceramic material of the substrate and the cover. When the glass sealant has coled down, the package is hermetically sealed. The overall procedure is cost-effective, providing a highly reliable seal with very low probability of damage to the internal circuitry, and capable of achieving a high yield in commercial production.

BRIEF DESCRIPTION OF THE DRAWINGS

FIG. 1 is a diagrammatic showing of a package comprising a substrate and cover, mounted in a clamping fixture in preparation for carrying out a sealing procedure in accordance with this invention;

FIG. 2 is a horizontal section taken along line 2—2 of FIG. 1, and also showing the outline of the seal area;

FIG. 3 is a perspective view showing four infra-red line-focussed radiant-heat sources positioned to apply radiation simultaneously to the four side interface areas between the substrate and cover components;

FIG. 4 is a schematic sectional view illustrating a known type of line-focussed infra-red source; and FIG. 5 is a graph showing the variation in temperature at selected locations in the substrate/cover package structure during the sealing procedure.

DESCRIPTION OF THE PREFERRED EMBODIMENT

Referring now to FIGS. 1 and 2, there is shown a rectangular ceramic substrate 10 adapted to support microelectronic circuit elements as illustrated at 12. Before these circuit elements are placed or fabricated on the substrate, conductors (not shown) in accordance with the particular circuit design are applied to the substrate surface by conventional thick-film techniques. Thereafter, the substrate receives an application of a sealing compound throughout a rectangular sealing area as indicated at 14, crossing over the portions of the already-applied conductors which are to make connections to the external pins 16 of the completed package, such conductor portions being schematically illustrated at 12a.

This sealing compound preferably is in the form of a paste-like glass frit which is screened or "painted" onto the substrate as by means of a conventional thick-film screen and printing machine (not shown). The substrate then receives a drying and air-firing treatment (e.g. 420° C. for 20 minutes), to burn off all of the organic components and to produce a smooth glass coating over the entire sealing area 14.

The microelectronic circuitry 12 then is placed or fabricated on the prepared substrate in known fashion, e.g. including conventional screen printing of organic adhesive and placement of circuit elements thereon. Appropriate connections are made to the already-applied conductors including those portions 12a leading to the pins 16. The fully-fabricated substrate then is electrically tested to assure compliance with pertinent specifications. If the unit is satisfactory, a four-sided ceramic cover 18 is placed on the substrate, and the assembled package structure is installed in a fixture comprising a support block 20 and a clamp schematically illustrated at 22. The lower surfaces of the cover side walls are aligned with and contact the fired glass coating 14 on the substrate, and the clamp 22 presses the cover and the substrate together with a moderate force, e.g. 3 or 4 pounds.

With the package components held firmly in place as shown, infra-red radiation is applied simultaneously to all of the interface regions between the substrate 10 and the cover 18. For this purpose, the assembled package structure is surrounded on all four sides by respective line-focussed infra-red radiant heaters 24. (These units are identified in FIG. 3 as 24a through 24d; see also FIG. 4.) The radiation from each of these heaters is focussed directly onto a corresponding interface line between the cover and the substrate; that is, the radiation strikes only those portions of the cover and substrate which are immediately adjacent the interface. The region of focus is relatively narrow, for example, having a height of only about 0.1" along the interface line. The portions of the package structure away from the interface, and especially the major regions of the side walls of the cover, are relatively free from any radiant energy so that heat transfer into the package interior through those regions is substantially minimized.

The radiant heat energy in accordance with this invention strikes both the cover and the substrate on both sides of the glass coating, i.e. above and below the interface, so that heat from both package components is transferred rapidly and in substantial amount to the glass coating 14. Thus the glass quickly softens and remelts. The force of the clamp 22 serves to disperse the molten glass over the sealing area, and prevents the formation of pin holes that otherwise would be caused by escaping atmospheric gases. Preferably, the sealing procedure is carried out in a moisture-free, inert gas atmosphere, such as nitrogen, to assure optimum hermetic sealing.

Advantageously the support block 20 serves as a heat source/sink. Thus the block is maintained at a constant elevated temperature throughout the sealing procedure to aid in stabilizing the temperature of the package interior. This particularly minimizes the temperature gradient across the substrate, and the block acts as a thermal shield for the packaged elements mounted on the substrate. For certain commercial applications, a source/sink temperature of 150° C. has been found suitable. Such an elevated temperature can be developed in any conventional manner, as illustrated schematically by a resistive heating element 26, and regulation of the block temperature also is effected in conventional fashion as by thermostatic controls.

After the infra-red radiation has been on for a period of time sufficient to fully remelt the glass coating 14, and to provide for fusion and/or chemical bonding between the glass and the adjacent package components, the radiation is removed to allow the heated parts to cool and the glass to harden. The resulting completed package provides long-lived true hermetic sealing of the interior elements, since the ceramic and glass package components all are sturdy and non-permeable.

Referring now to the temperature vs. time graph of FIG. 5, it will be seen that the sealing procedure in accordance with this invention is well adapted to preventing excessive rises in interior package temperatures which might damage the packaged circuitry. The upper curve 30 represents the temperature of the seal areas, i.e. the interface between the substrate 10 and the cover 18, and shows that the glass frit sealant temperature reached a plateau of about 450° C. during the sealing procedure. The next curve 32 represents the interior temperature in the region where the temperature-sensitive elements are located, and shows that the temperature there did not go above 150° C., a temperature which would not damage typical packaged elements, particularly during the short period of exposure. The bottom curve 34 represents the temperature of the inert, dry atmosphere surrounding the package components, and shows that that temperature reached only about 60° C. during the sealing period.

In the package configuration shown in FIG. 3, the side walls of the cover 18 are located immediately adjacent the edges of the substrate 10, on all sides thereof. This provides for maximum area of protected coverage on the substrate, with minimum required package area. It also may be noted that the heat source/sink 20a illustrated in FIG. 3 is larger in plan area than the substrate 10, so that it extends out from beneath the substrate on all sides. This relationship has been found desirable for certain applications, to help assure good temperature stability. When this arrangement is used, the substrate pins 16 are not installed until after the interface sealing has been completed. Also omitted from FIG. 3 is any showing of the clamp 22, for the sake of simplicity.

The particular infra-red heaters 24a–24d, including their cables and water-cooling hoses 36 are of conventional, known construction, and therefore a detailed description of those elements is not included herein. There are extensive patent disclosures relating to such devices, going back many years. Simply by way of example, with no attempt to be exhaustive, reference may be made to U.S. Pat. Nos. 3,374,531; 3,586,813; 3,661,369; 3,718,800; 3,836,745; and 3,879,164.

When the glass coating 14 melts during the sealing process, the pressure of the clamp 20 causes a small movement of the cover 18 towards the substrate 10, as the glass coating is dispersed, under pressure, to spread throughout the sealing area. Such movement of the cover can be sensed to provide an external indication that the glass has melted. To show this pictorially, the clamp 22 in FIG. 1 has been provided with a schematically illustrated switch-operating arm 40 positioned to press against and close a switch 42 when sufficient movement has taken place to show that the glass has been properly melted. The switch 42 is shown connected to a pair of wires 44 leading to the power control circuit (not shown) for the infra-red heaters 24. The switch closure may, for example, actuate a relay which interrupts the main power line for the heaters.

Although glass frit paste is described hereinabove as being applied only to the substrate 10, it will be understood that for some products it may be advantageous to also/only apply the glass frit to the lower surfaces of the cover 18, followed by air-drying and firing as described. Such dual glass coatings will provide an advantageous amount of melt, which may be useful for certain types of package constructions; whereas a single glass coating on the cover sealing surfaces will be necessary when pre-screening of the glass frit on the substrate is not practicable.

For some applications, it may be advantageous to add to the outside of the completed package structure an epoxy bead/covering the glass coating at the interface between the substrate 10 and the cover 18. Such epoxy can be applied as a pre-form, dimensioned to fit around the package, as illustrated exaggeratedly at 46 in FIG. 1. When such epoxy bead has been cured in situ, e.g. at elevated temperature, it will protect the vitreous glass sealant from the possible leaching action of chemical reagents.

Packages in accordance with the present invention have been successfully made using black-colored ceramic material of 91–92% alumina, obtained from the Kyocera Corporation. The vitreous glass frit was applied in the form of a paste consisting of milled particles of glass, binders and solvents. The vitreous glass used was supplied by Technology Glass Corporation under their No. LS 0803. The temperature coefficients of the ceramic substrate, the ceramic cover, and the glass sealant were all equal, and preferably in the range of about 5 to 12 parts per million per degree Centigrade.

One especially useful application of this invention is in packaging the microelectronic components of a hybrid isolation amplifier, e.g. including circuitry as disclosed in U.S. Pat. No. 4,286,225. The non-conductive nature of the ceramic and glass package elements eliminates problems which otherwise would be encountered in assuring adequate conductive isolation, freedom from high-voltage arcing, and operation in the presence of high common mode voltage, e.g. as high as ±8000 volts in some cases. A package for such application included a substrate having a thickness of about 40 mils, a length of about 2.6 inches, and a width of about 0.84 inches. The cover had a height of about 0.285 inches.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention disclosed herein.

I claim:

1. The method of packaging temperature-sensitive microelectronic devices, including hybrid integrated circuits, supported on a rigid hermetic planar substrate, comprising the steps of:

applying a meltable hermetic sealing material to a closed path defined by the interface between said substrate and a hermetic box-like cover surrounding the region for said microelectric devices;

placing on said substrate said heremitic box-like cover having side walls aligned with and contacting said sealing material completely around said closed path;

applying line-focused infra-red radiation onto the portions of both said substrate and said cover which are immediately adjacent the interface therebetween for a time sufficient to melt said sealing material to provide for interaction thereof with said substrate and said cover;

sensing relative movement between said box-like cover and said substrate resulting from the melting of said sealing material; and removing said application of infra-red radiation in response to a sensed predetermined extent of said relative movement.

2. The method of claim 1 wherein said line-focused infra-red radiation is applied by simultaneously applying said radiation only to the portions of both said substrate and said cover which are immediately adjacent the interface therebetween.

* * * * *